United States Patent
Tanaka

(10) Patent No.: US 9,401,378 B2
(45) Date of Patent: *Jul. 26, 2016

(54) SOLID-STATE IMAGING DEVICE AND METHOD FOR MANUFACTURING SOLID-STATE IMAGING DEVICE

(71) Applicant: Kabushiki Kaisha Toshiba, Minato-ku (JP)

(72) Inventor: Nagataka Tanaka, Oita (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/702,808

(22) Filed: May 4, 2015

(65) Prior Publication Data

US 2015/0236060 A1 Aug. 20, 2015

Related U.S. Application Data

(63) Continuation of application No. 14/105,887, filed on Dec. 13, 2013, now Pat. No. 9,053,995.

(30) Foreign Application Priority Data

Aug. 7, 2013 (JP) .................................. 2013-164363

(51) Int. Cl.
 *H01L 27/146* (2006.01)
(52) U.S. Cl.
 CPC .... *H01L 27/14612* (2013.01); *H01L 27/14643* (2013.01)
(58) Field of Classification Search
 CPC .... H01L 31/14; H01L 31/18; H01L 27/14643
 See application file for complete search history.

(56) References Cited

U.S. PATENT DOCUMENTS 7,034,347 B2   4/2006   Kuriyama
7,687,299 B2   3/2010   Ichikawa (Continued)

FOREIGN PATENT DOCUMENTS

JP    2005-286168    10/2005
JP    3793205 B2    7/2006

(Continued)

OTHER PUBLICATIONS

Office Action issued Sep. 10, 2015 in Korean Patent Application No. 10-2014-0023407 (with English language translation).

(Continued)

*Primary Examiner* — Marc Armand
(74) *Attorney, Agent, or Firm* — Oblon, McClelland, Maier & Neustadt, L.L.P

(57) ABSTRACT

According to one embodiment, a solid-state imaging device is provided. The solid-state imaging device includes a photoelectric conversion element, a floating diffusion, and an amplifying transistor. The photoelectric conversion element photoelectrically convert incident light into electric charges with an amount corresponding to an amount of the incident light, and accumulates the electric charges. The floating diffusion accumulates the electric charges read out from the photoelectric conversion element. The amplifying transistor includes a gate electrode connected to the floating diffusion, and outputs a signal based on the amount of the electric charges accumulated in the floating diffusion. The amplifying transistor includes a first concentration region disposed in at least a part of the maximum region of the depletion layer and a second concentration region disposed at a deeper position than the first concentration region, and has higher impurity concentration than that of the first concentration region.

7 Claims, 10 Drawing Sheets

(56) References Cited

U.S. PATENT DOCUMENTS

| | | |
|---|---|---|
| 7,714,263 B2 | 5/2010 | Konishi |
| 7,939,859 B2 | 5/2011 | Tsuno |
| 7,968,922 B2 | 6/2011 | Ichikawa |
| 8,013,369 B2 | 9/2011 | Iwata et al. |
| 8,192,886 B2 | 6/2012 | Mizusaki et al. |
| 8,415,724 B2 | 4/2013 | Iwata et al. |
| 2004/0183109 A1 | 9/2004 | Kuriyama |
| 2009/0212336 A1 | 8/2009 | Iwata et al. |
| 2009/0289282 A1 | 11/2009 | Tsuno |
| 2010/0321518 A1* | 12/2010 | Shinohara .................. 348/222.1 |
| 2011/0134264 A1 | 6/2011 | Nishihara et al. |
| 2011/0272750 A1 | 11/2011 | Iwata et al. |

FOREIGN PATENT DOCUMENTS

| | | |
|---|---|---|
| JP | 2009-43791 | 2/2009 |
| JP | 2009-206260 A | 9/2009 |
| JP | 2009-212029 | 9/2009 |
| JP | 2009-283649 A | 12/2009 |
| JP | 2011-119441 | 6/2011 |

OTHER PUBLICATIONS

Office Action issued Apr. 16, 2015 in Korean Patent Application No. 10-2014-23407 (with English language translation).

Office Action issued Aug. 17, 2015 in Taiwanese Patent Application No. 103107667 (with English translation).

* cited by examiner

SOLID-STATE IMAGING DEVICE AND METHOD FOR MANUFACTURING SOLID-STATE IMAGING DEVICE

CROSS-REFERENCE TO RELATED APPLICATIONS

This application is a continuation of and claims the benefit of priority under 35 U.S.C. §120 from U.S. Ser. No. 14/105,887 filed Dec. 13, 2013, and claims the benefit of priority under 35 U.S.C. §119 from Japanese Patent Application No. 2013-164363 filed Aug. 7, 2013; the entire contents of each of which are incorporated herein by reference.

FIELD

Embodiments described herein relate generally to a solid-state imaging device and a method for manufacturing the solid-state imaging device.

BACKGROUND

Conventionally, a solid-state imaging device includes a plurality of photoelectric conversion elements disposed corresponding to respective pixels of a captured image. Each photoelectric conversion element photoelectrically converts incident light into electric charges of an amount corresponding to the received light intensity and accumulates the electric charges in a charges storage region.

The solid-state imaging device reads out the electric charges accumulated in the charges storage region of each photoelectric conversion element using a read-out transistor and accumulates the electric charges in a floating diffusion. Subsequently, an image signal is obtained after an amplifying process by an amplifying transistor.

The amplifying transistor amplifies an image signal corresponding to the amount of electric charges accumulated in the floating diffusion (an FD voltage) and outputs the amplified image signal. Accordingly, the output of the amplifying transistor is preferred to change linearly with respect to the FD voltage in order to obtain an appropriate image signal.

DETAILED DESCRIPTION

In general, according to one embodiment, a solid-state imaging device is provided. The solid-state imaging device includes a photoelectric conversion element, a floating diffusion, and an amplifying transistor. The photoelectric conversion element photoelectrically convert incident light into electric charges with an amount corresponding to an amount of the incident light, and accumulates the electric charges. The floating diffusion accumulates the electric charges read out from the photoelectric conversion element. The amplifying transistor includes a gate electrode connected to the floating diffusion, and outputs a signal based on the amount of the electric charges accumulated in the floating diffusion. The amplifying transistor includes a first concentration region disposed in at least a part of the maximum region of the depletion layer and a second concentration region disposed at a deeper position than the first concentration region, and has higher impurity concentration than that of the first concentration region.

Exemplary embodiments of a solid-state imaging device and a method for manufacturing the solid-state imaging device will be explained below in detail with reference to the accompanying drawings. The present invention is not limited to the following embodiments.

First Embodiment

Figure 1:
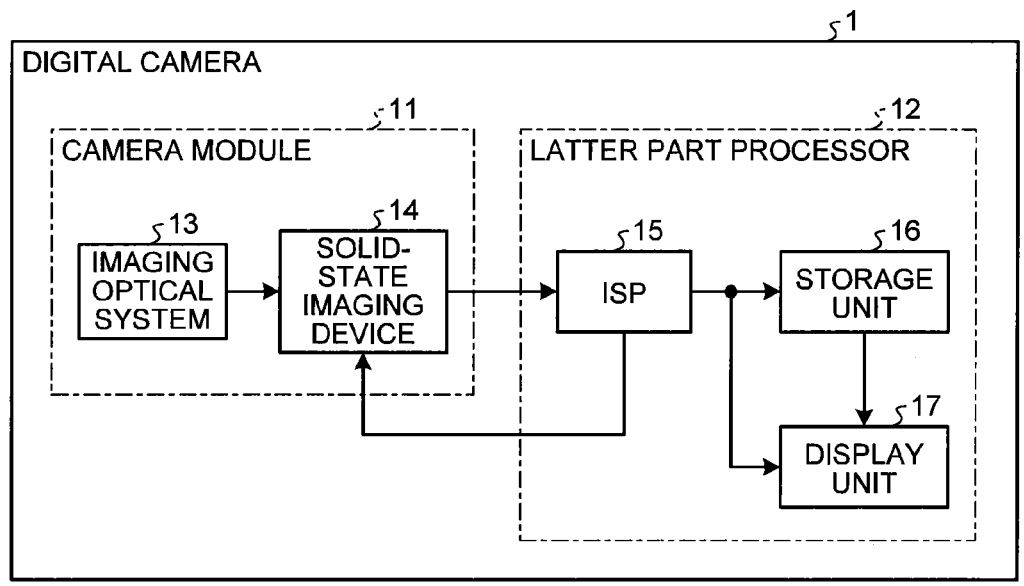
FIG. 1 is a block diagram illustrating a schematic configuration of a digital camera with a solid-state imaging device according to a first embodiment.

FIG. 1 is a block diagram illustrating a schematic configuration of a digital camera 1 with a solid-state imaging device 14 according to a first embodiment. As illustrated in FIG. 1, the digital camera 1 includes a camera module 11 and a latter part processor 12.

The camera module 11 includes an imaging optical system 13 and the solid-state imaging device 14. The imaging optical system 13 receives light from a photographic subject and forms an image of a photographic subject image. The solid-state imaging device 14 takes the photographic subject image formed by the imaging optical system 13, and outputs an image signal obtained by taking the image to the latter part processor 12. This camera module 11 is applied, for example, to electronic devices such as a portable terminal with camera in addition to the digital camera 1.

The latter part processor 12 includes an Image Signal Processor (ISP) 15, a storage unit 16, and a display unit 17. The ISP 15 performs a signal process of the image signal input from the solid-state imaging device 14. This ISP 15 performs, for example, a high quality image process such as a denoising process, a defective pixel correction process, and a resolution conversion process.

Figure 2:
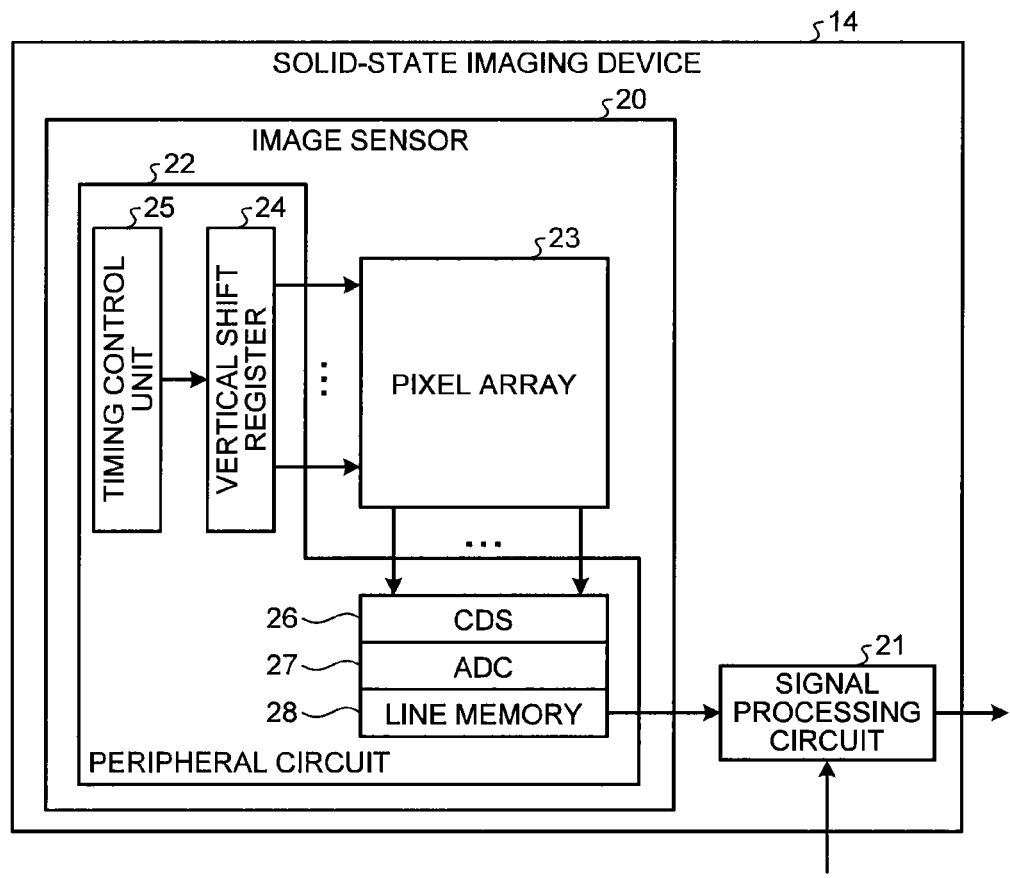
FIG. 2 is a block diagram illustrating a schematic configuration of the solid-state imaging device according to the first embodiment.

Then, the ISP 15 outputs the image signal after the signal process to the storage unit 16, the display unit 17, and a signal processing circuit 21, which will be described below (see FIG. 2). The signal processing circuit 21 is included in the solid-state imaging device 14 in the camera module 11. The image signal fed back from the ISP 15 to the camera module 11 is used for adjustment and control of the solid-state imaging device 14.

The storage unit 16 stores the image signal input from the ISP 15 as an image. The storage unit 16 outputs the image signal of the stored image to the display unit 17 according to, for example, an operation by the user. The display unit 17 displays an image corresponding to the image signal input from the ISP 15 or the storage unit 16. This display unit 17 is, for example, a liquid crystal display.

Next, with reference to FIG. 2, the solid-state imaging device 14 included in the camera module 11 will be described. FIG. 2 is a block diagram illustrating a schematic configuration of the solid-state imaging device 14 according to the first embodiment. As illustrated in FIG. 2, the solid-state imaging device 14 includes an image sensor 20 and the signal processing circuit 21.

The image sensor 20 includes a peripheral circuit 22 and a pixel array 23. The peripheral circuit 22 includes a vertical shift register 24, a timing control unit 25, a correlated double sampling unit (CDS) 26, an analog-to-digital converter (ADC) 27, and a line memory 28.

The pixel array 23 is disposed in an imaging area of the image sensor 20. In the pixel array 23, photodiodes as a plurality of photoelectric conversion elements corresponding to respective pixels of the captured image are disposed in the horizontal direction (row direction) and the vertical direction (column direction) in a two-dimensional array pattern. In the pixel array 23, each photoelectric conversion element corresponding to each pixel generates a signal charges (for example, electrons) corresponding to an amount of incident light.

Figure 3:
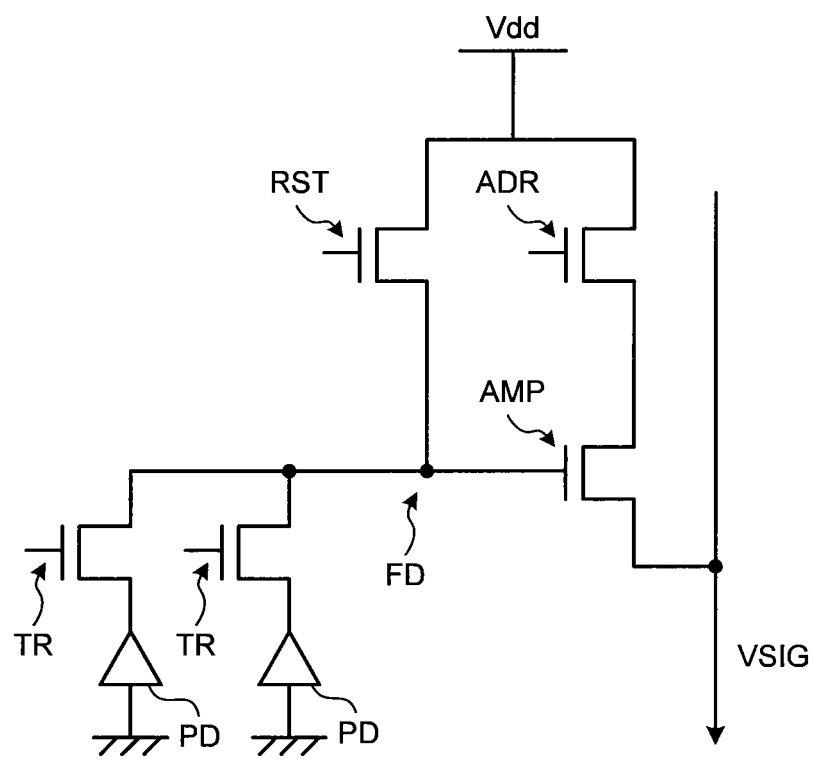
FIG. 3 is a diagram illustrating one example of a circuit configuration of a pixel array according to the first embodiment.

Here, a circuit configuration of this pixel array 23 will be described with reference to FIG. 3. FIG. 3 is a diagram illustrating one example of the circuit configuration of the pixel array 23 according to the first embodiment. The circuit illustrated in FIG. 3 is a circuit selectively extracted from a part corresponding to two pixels of the captured image in the pixel array 23.

As illustrated in FIG. 3, the pixel array 23 includes photoelectric conversion elements PD, read-out transistors TR, and a floating diffusion FD. The pixel array 23 includes a reset transistor RST, an address transistor ADR, and an amplifying transistor AMP.

The photoelectric conversion element PD photoelectrically converts incident light into electric charges of an amount corresponding to an amount of the incidest light, and accumulates the electric charges. In the photoelectric conversion element PD, a cathode is connected to the ground, and an anode is connected to a source of the read-out transistor TR.

The read-out transistor TR is disposed corresponding to the photoelectric conversion element PD, and reads out the signal charges accumulated in the photoelectric conversion element PD so as to transfer the signal charges to the floating diffusion FD in the case where a gate electrode of the read-out transistor TR receives a transfer signal. A drain of the read-out transistor TR is connected to the floating diffusion FD.

The floating diffusion FD temporarily accumulates the signal charges transferred from the read-out transistor TR. This floating diffusion FD is connected to a source of the reset transistor RST.

A drain of the reset transistor RST is connected to a power supply voltage line Vdd. This reset transistor RST resets the electric potential of the floating diffusion FD to the electric potential of the power supply voltage in the case where a gate electrode of the reset transistor RST receives a reset signal before the signal charges is transferred to the floating diffusion FD.

The floating diffusion FD is connected to a gate electrode of the amplifying transistor AMP. A source of the amplifying transistor AMP is connected to a signal line for outputting the signal charges to the peripheral circuit 22. A drain of the amplifying transistor AMP is connected to a source of the address transistor ADR. A drain of the address transistor ADR is connected to the power supply voltage line Vdd.

In the pixel array 23, in the case where an address signal is input into a gate electrode of the address transistor ADR, the amplifying transistor AMP amplifies an image signal VSIG in accordance with a voltage of the floating diffusion FD (hereinafter, "FD voltage") that varies depending on an amount of signal charges acculated in the floating diffusion FD, and outputs the amplified image signal VSIG to the peripheral circuit 22.

Thus, in the solid-state imaging device 14, the amplifying transistor AMP changes the image signal VSIG corresponding to the FD voltage, which is changed corresponding to the amount of the signal charges generated in the photoelectric conversion element PD, so as to obtain the image signal corresponding to the photographic subject image. Therefore, the output of the amplifying transistor AMP is preferred to be changed linearly with respect to the FD voltage in order to obtain an appropriate image signal corresponding to the photographic subject image.

However, a conventional amplifying transistor has a tendency that output linearity to the FD voltage is deteriorated in the case where the photographic subject is comparatively bright (hereinafter, "in the bright situation") compared with the case where the photographic subject is comparatively dark (hereinafter, "in the dark situation").

Figure 4A:
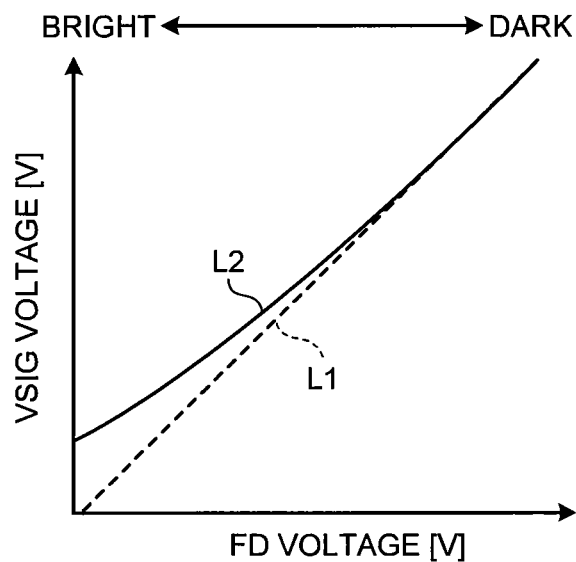
FIGS. 4A and 4B are graphs illustrating an output characteristic of a conventional amplifying transistor.
Figure 4B:
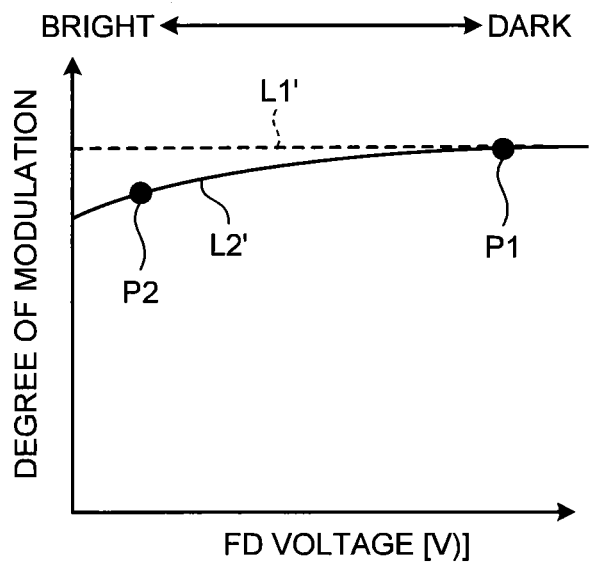

This point will be described with reference to FIG. 4A and FIG. 4B. FIG. 4A and FIG. 4B are graphs illustrating output characteristics of the conventional amplifying transistor.

Here, FIG. 4A illustrates a relationship between a voltage of the image signal VSIG output from the conventional amplifying transistor (hereinafter described as a "VSIG voltage") and the FD voltage. In FIG. 4A, an ideal output characteristic L1 and an actual output characteristic L2 are respectively illustrated by a dashed line and a solid line. FIG. 4B illustrates a relationship between: respective differential values L1' and L2' of the output characteristics L1 and L2 illustrated in FIG. 4A ($\Delta$VSIG voltage/$\Delta$FD voltage: hereinafter described as a "degree of modulation"); and the FD voltage.

As illustrated in FIG. 4A, the output characteristic L2 of the conventional amplifying transistor is a characteristic close to the ideal output characteristic L1 in the dark situation. That is, the conventional amplifying transistor outputs an appropriate VSIG voltage corresponding to the FD voltage in the dark situation.

On the other hand, the output characteristic L2 of the conventional amplifying transistor is found to be further away from the ideal output characteristic L1 as the photographic subject becomes brighter. Specifically, the conventional amplifying transistor is prone to output a higher VSIG voltage than the ideal VSIG voltage as the photographic subject becomes brighter. As a result, as illustrated in FIG. 4B, the conventional amplifying transistor provides a lower degree of modulation as the photographic subject becomes brighter.

Figure 5A:
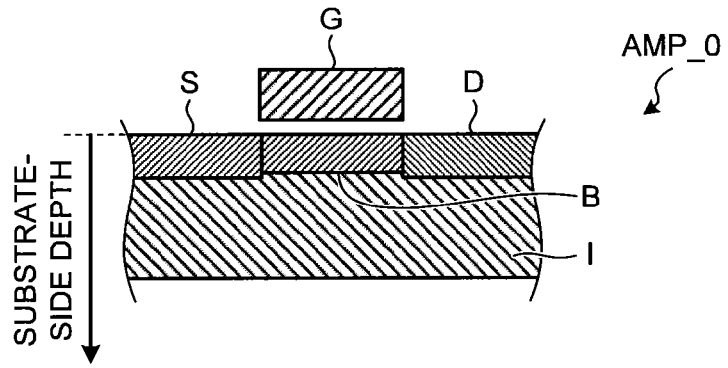
FIGS. 5A and 5B are schematic cross-sectional views of the conventional amplifying transistor.
Figure 5B:
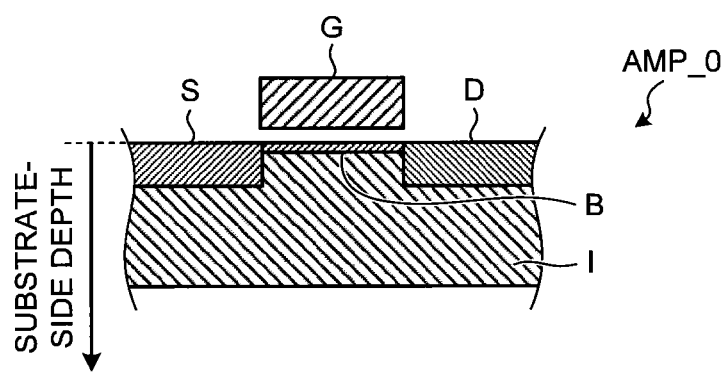
Figure 5C:
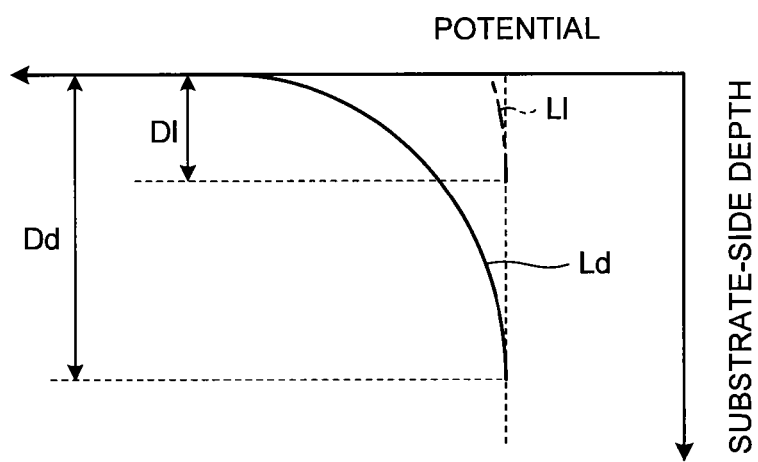
FIG. 5C is a graph illustrating a relationship between: a substrate-side depth of a depletion layer formed in the conventional amplifying transistor, and a potential.

Thus, in the conventional amplifying transistor, non-linearity is likely to appear in the output characteristic in the bright situation. The cause of this non-linearity will be specifically described with reference to FIG. 5A to FIG. 5C. FIG. 5A and FIG. 5B are schematic cross-sectional views of the conventional amplifying transistor. FIG. 5A illustrates a schematic cross-sectional view in the dark situation. FIG. 5B illustrates a schematic cross-sectional view in the bright situation. FIG. 5C is a graph illustrating a relationship between a substrate-side depth of a depletion layer formed in the conventional amplifying transistor and a potential (a channel surface potential just under a gate electrode).

As illustrated in FIG. 5A, a conventional amplifying transistor AMP_0 includes a gate electrode G connected to the floating diffusion. The amplifying transistor AMP_0 includes a source S and a drain D in a well region I of a semiconductor substrate.

In the amplifying transistor AMP_0, a depletion layer B is formed on the substrate surface between the source S and the drain D. The depletion layer B is an electrically insulated region without any carrier.

The FD voltage in the dark situation is higher than that in the bright situation. Accordingly, a difference in electric potential between the gate electrode G and the substrate is large. The depletion layer B largely extends from the surface of the well region I in a direction of the substrate-side depth (see Ld and Dd in FIG. 5C).

Here, assuming that the capacitance of the gate electrode G is CG and the capacitance of the depletion layer B is CB, the degree of modulation ($\Delta$VSIG voltage/$\Delta$FD voltage) is expressed by CG/(CG∥CB). The capacitance CB of the depletion layer B is inversely proportional to the width of the depletion layer B. Accordingly, the capacitance CB of the depletion layer B decreases as the depletion layer B extends further. The decrease in CB increases the degree of modulation. Thus, the degree of modulation becomes higher in the dark situation (see P1 in FIG. 4B).

On the other hand, as illustrated in FIG. 5B, the FD voltage becomes lower in the bright situation compared with that in the dark situation. Accordingly, the difference in electric potential between the gate electrode G and the substrate is small compared with that in the dark situation. The depletion layer B becomes narrower compared with that in the dark situation (see L1 and D1 in FIG. 5C). Then, the capacitance CB of the depletion layer B becomes larger as the width of the depletion layer B becomes narrower. Accordingly, the degree of modulation becomes lower. Therefore, the degree of modulation becomes lower in the bright situation (see P2 in FIG. 4B).

Thus, in the conventional amplifying transistor, non-linearity appears in the output characteristic because the width of the depletion layer B in the dark situation is different from the width of the depletion layer in the bright situation.

In the solid-state imaging device 14 according to the first embodiment, the variation in the width of the depletion layer B in the dark situation and in the bright situation is minimized so as to obtain the amplifying transistor AMP with a satisfactory output linearity.

Figure 6:
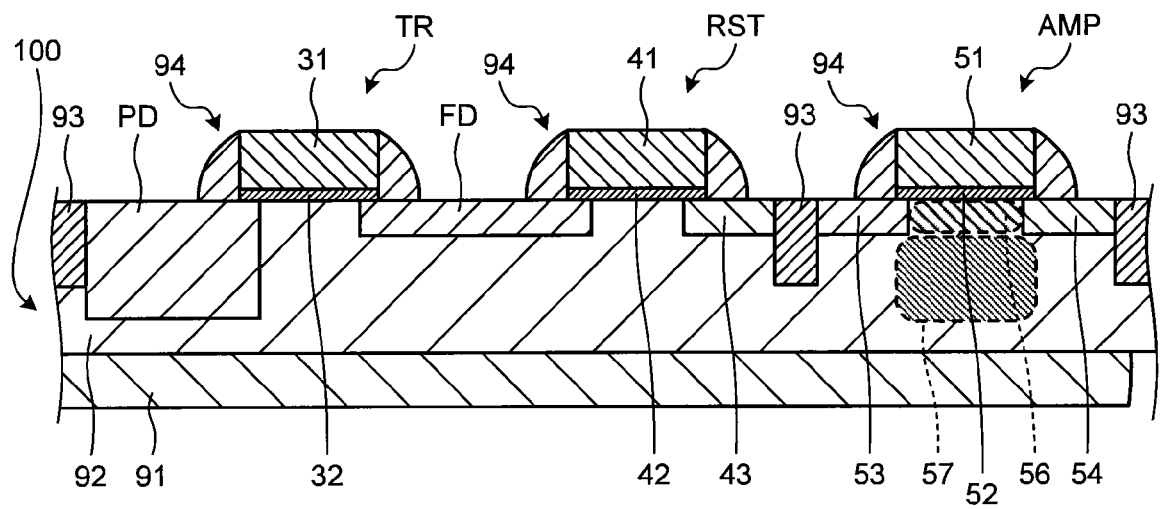
FIG. 6 is a schematic cross-sectional view of the pixel array according to the first embodiment.
Figure 7:
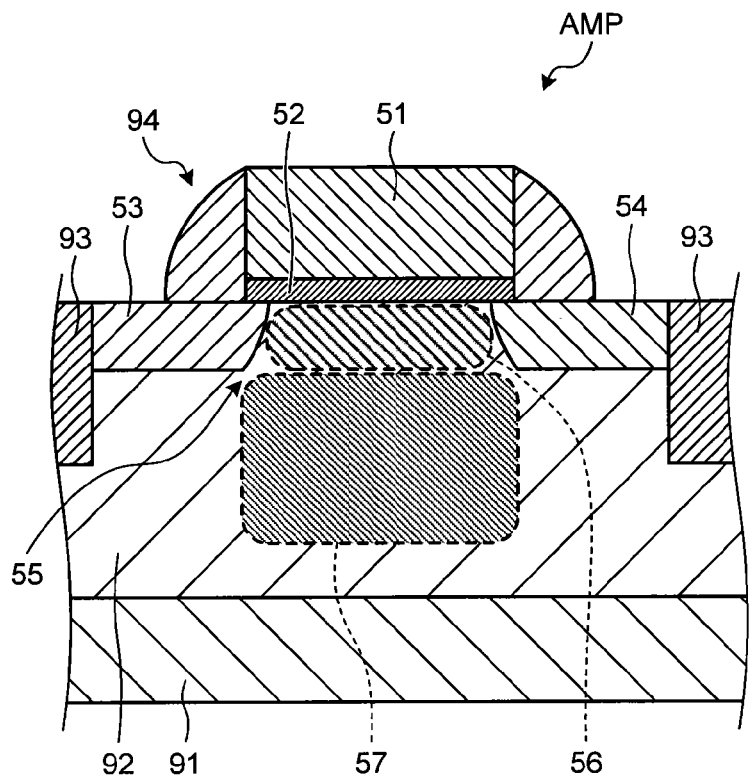
FIG. 7 is a schematic cross-sectional view of an amplifying transistor according to the first embodiment.
Figure 8:
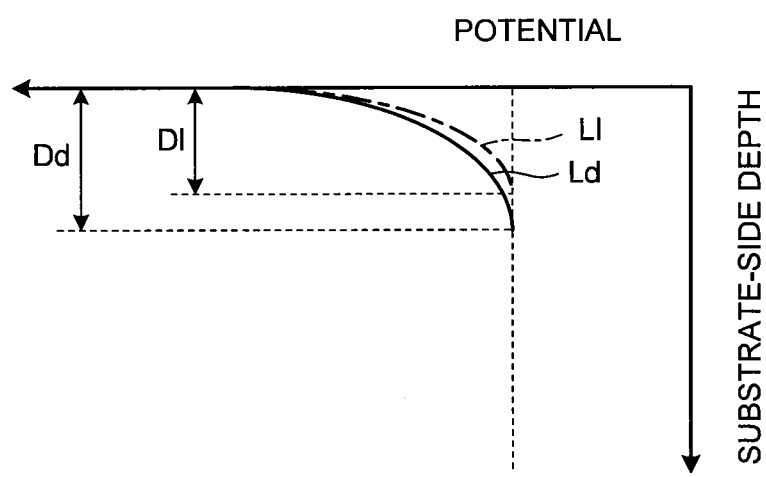
FIG. 8 is a graph illustrating a relationship between: a substrate-side depth of a depletion layer formed in the amplifying transistor according to the first embodiment, and a potential.

A configuration of this amplifying transistor AMP will be described with reference to FIG. 6 to FIG. 8. FIG. 6 is a schematic cross-sectional view of the pixel array 23 according to the first embodiment. FIG. 7 is a schematic cross-sectional view of the amplifying transistor AMP according to the first embodiment. FIG. 8 is a graph illustrating a relationship between: the substrate-side depth of the depletion layer formed in the amplifying transistor AMP according to the first embodiment, and the potential.

FIG. 6 schematically illustrates a cross section of a portion including the photoelectric conversion element PD, the read-out transistor TR, the floating diffusion FD, the reset transistor RST, and the amplifying transistor AMP. Here, while the illustration is omitted, a supporting substrate is disposed at the lower layer side of the structure illustrated in FIG. 6 via an interlayer insulating film where a multilayer interconnection layer is formed. In the upper layer of the structure illustrated in FIG. 6, a color filter is disposed. The color filter selectively transmits incident light of a predetermined color through the interlayer insulating film. On the top surface of the color filter, a microlens is disposed. The microlens condenses incident light to a light receiving portion of the photoelectric conversion element PD.

As illustrated in FIG. 6, the pixel array 23 includes a semiconductor substrate 100 where a P-type well layer 92 is disposed on a SUB layer 91 of a first conductivity type (hereinafter described as "N type") or a second conductivity type (hereinafter described as "P type").

The pixel array 23 includes the photoelectric conversion element PD. The photoelectric conversion element PD is formed of, for example, a P-type semiconductor region and an N-type the semiconductor region. The P-type semiconductor region extends from the top surface of the semiconductor substrate 100 along the depth direction of the semiconductor substrate 100. The N-type semiconductor region extends from the inferior surface of the P-type semiconductor region along the depth direction of the semiconductor substrate 100.

The pixel array 23 includes a gate electrode 31 of the read-out transistor TR, a gate electrode 41 of the reset transistor RST, and a gate electrode 51 of the amplifying transistor AMP. These gate electrodes 31, 41, and 51 are disposed on the semiconductor substrate 100 via the respective gate oxide films 32, 42, and 52. A side wall 94 is disposed on each side surface of the gate electrodes 31, 41, and 51.

The floating diffusion FD doped with N-type impurity is disposed inside of the semiconductor substrate 100 between the gate electrode 31 of the read-out transistor TR and the gate electrode 41 of the reset transistor RST.

Inside of the semiconductor substrate 100, semiconductor regions doped with N-type impurity are disposed in predetermined respective positions for a drain 43 of the reset transistor RST and a source 53 and a drain 54 of the amplifying transistor AMP. The photoelectric conversion element PD, the read-out transistor TR, and the reset transistor RST are electrically element-isolated from the amplifying transistor AMP by an STI 93.

FIG. 7 illustrates a schematic enlarged view of the amplifying transistor AMP illustrated in FIG. 6. As illustrated in FIG. 7, the amplifying transistor AMP according to the first embodiment includes a first concentration region 56 and a second concentration region 57 in the well layer 92. The first concentration region 56 has a low impurity concentration. The second concentration region 57 has a higher impurity concentration compared with the first concentration region 56.

The first concentration region 56 is disposed in at least a part of a maximum region 55 of the depletion layer formed between the source 53 and the drain 54. The maximum region 55 of the depletion layer (hereinafter described simply as "the maximum region 55") is the maximum region within which the depletion layer can extend. Specifically, the maximum region 55 is a region of the depletion layer formed in the case where the photoelectric conversion element PD is not receiving light.

The depletion layer is likely to extend more as the well layer 92 has lower impurity concentration. Accordingly, disposing the first concentration region 56 with low impurity concentration in the maximum region 55 allows the depletion layer to extend largely in the same way as in the dark situation where the depletion layer extends readily, even in the bright situation where the depletion layer does not extend readily.

The width of the maximum region 55, that is, the maximum depth of the depletion layer is, for example, 0.2 μm that is approximately the same maximum depth (width) of the source 53 and the drain 54. The depletion layer can be formed up to a deeper position than the maximum depth of the source 53 and the drain 54. The first concentration region 56 is disposed in a shallower position than the maximum depth of the source 53 and the drain 54.

The second concentration region 57 is disposed adjacent to the first concentration region 56 in a deeper position than the first concentration region 56. The depletion layer has difficulty in extending as the well layer 92 has higher impurity concentration. Accordingly, the second concentration region 57 with higher impurity concentration than that of the first concentration region 56 is disposed at a lower side of the first concentration region 56, so as to reduce extension of the depletion layer.

Thus, the amplifying transistor AMP according to the first embodiment facilitates the extension of the depletion layer in the first concentration region 56 while reducing the extension of the depletion layer in the second concentration region 57. This reduces the difference between: the width of the depletion layer formed in the dark situation; and the width of the depletion layer formed in the bright situation (see Dd and D1 in FIG. 8). The amplifying transistor AMP according to the first embodiment improves the output linearity compared with the conventional amplifying transistor AMP_0.

Figure 9A:
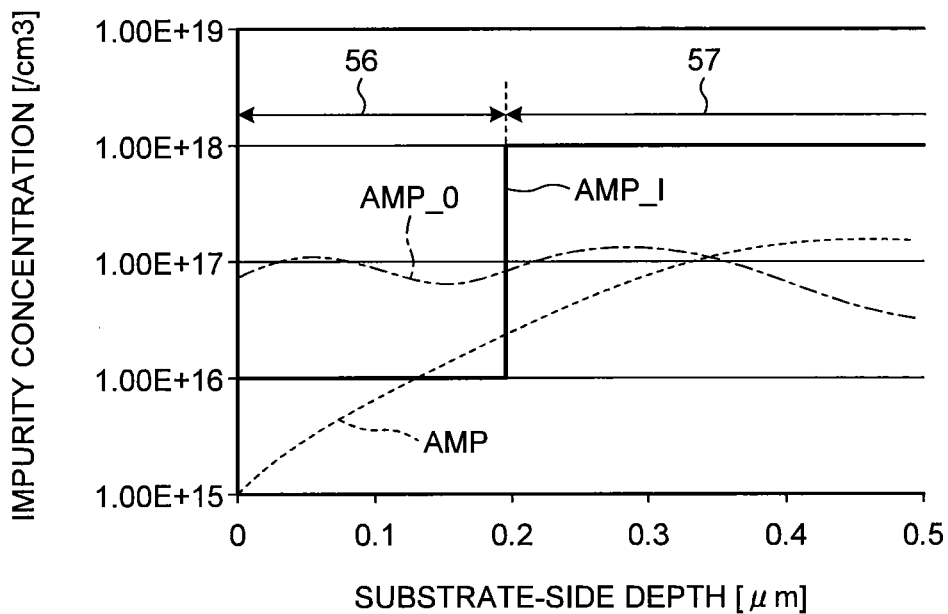
FIG. 9A is a graph illustrating a relationship between the substrate-side depth and impurity concentration of the amplifying transistor according to the first embodiment.
Figure 9B:
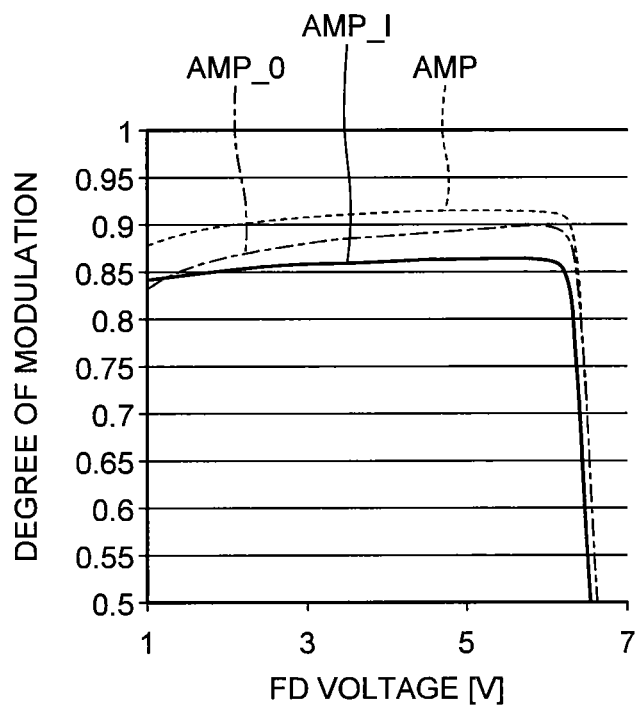
FIG. 9B is a graph illustrating a relationship between an FD voltage and a degree of modulation of the amplifying transistor according to the first embodiment.

Next, a description will be specifically given of a relationship between the substrate-side depth and the impurity concentration of the amplifying transistor AMP according to the first embodiment with reference to FIG. 9A and FIG. 9B. FIG. 9A is a graph illustrating the relationship between the substrate-side depth and the impurity concentration. FIG. 9B is a graph illustrating a relationship between the FD voltage and the degree of modulation.

Here, FIG. 9A illustrates a relationship between the substrate-side depth and the impurity concentration of the conventional amplifying transistor AMP_0 by a one-dot chain line, and illustrates a relationship between the substrate-side depth and the impurity concentration of the amplifying transistor AMP according to the first embodiment by a dashed line.

In FIG. 9A, a solid line indicates an ideal model AMP_I where a region with constant impurity concentration of 1.00E+16 (/cm3) and a region with constant impurity concentration of 1.00E+18 (/cm3) are adjacent to each other at a substrate-side depth of 0.2 μm.

The first concentration region 56 and the second concentration region 57 of the amplifying transistor AMP according to the first embodiment are formed based on the ideal model AMP_I illustrated in FIG. 9A. For example, impurity such as boron is implanted with an implantation energy of 120 KeV in a position at the substrate-side depth of about 0.45 μm. Subsequently, an annealing process is performed so as to form the second concentration region 57 with high impurity concentration.

The impurity implanted into the well layer 92 is diffused by the above-described annealing process. Accordingly, the first concentration region 56 with lower impurity concentration than that of the second concentration region 57 is formed in a shallower position than the second concentration region 57. The impurity concentration of the first concentration region 56 is equal to or less than at least ½ of the impurity concentration of the second concentration region 57.

On the other hand, the conventional amplifying transistor AMP_0 is formed with constant impurity concentration in the substrate-side depth. For example, impurity such as boron is implanted with respective implantation energies of 80 KeV and 120 KeV in positions at the substrate-side depths of about 0.08 μm and about 0.28 μm. Subsequently, an annealing process is performed so as to form regions with roughly uniform impurity concentrations.

Thus, in the conventional amplifying transistor AMP_0, the well layer is formed with constant impurity concentration. Therefore, a difference in width of the depletion layer occurs between in the dark situation and in the bright situation. This caused the low output linearity. As illustrated in FIG. 9B, it is seen that the degree of modulation of the conventional amplifying transistor AMP_0 has a large gradient compared with the ideal model AMP_I, thus providing low linearity of the degree of modulation.

In contrast, it is seen that the degree of modulation of the amplifying transistor AMP according to the first embodiment has a small gradient compared with the conventional amplifying transistor AMP_0, thus providing improved linearity of the degree of modulation compared with the conventional amplifying transistor AMP_0.

As described above, with the amplifying transistor AMP according to the first embodiment, the second concentration region 57 and the first concentration region 56 with lower impurity concentration than that of the second concentration region 57 are disposed. This reduces the difference in width of the depletion layer between in the dark situation and in the bright situation, thus improving the output linearity.

Next, a description will be given of a method for manufacturing the solid-state imaging device 14 according to the first embodiment with reference to FIG. 10. FIG. 10 is a schematic cross-sectional view illustrating a manufacturing process of the solid-state imaging device 14 according to the first embodiment. A method for manufacturing a portion other than the pixel array 23 in the solid-state imaging device 14 is similar to that of a typical CMOS image sensor. Therefore, a description will be given of a method for manufacturing the pixel array 23 portion in the solid-state imaging device 14 below.

Figure 10A:
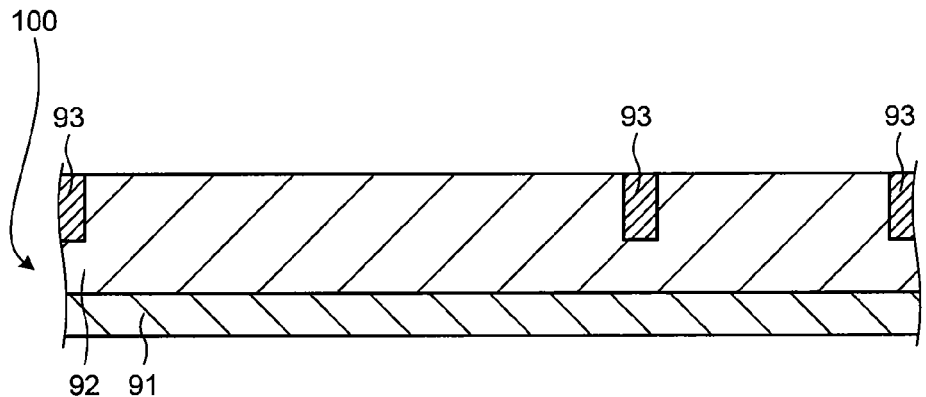
FIGS. 10A, 10B and 10C is a schematic cross-sectional view illustrating a manufacturing process of the solid-state imaging device according to the first embodiment.

As illustrated in FIG. 10(a), in the case where the pixel array 23 is manufactured, the silicon semiconductor substrate 100 where the N-type or P-type SUB layer 91 and the P-type well layer 92 are laminated is prepared.

Here, although the illustration is omitted, in a subsequent step, the interlayer insulating film that includes the multilayer interconnection layer is formed on the upper layer of the semiconductor substrate 100. The supporting substrate is laminated on the upper layer of the interlayer insulating film. Subsequently, in a state where the supporting substrate is supported, the surface on the opposite side of the surface on which the supporting substrate of the semiconductor substrate 100 is laminated is ground so as to expose the surface of the well layer 92.

The STI 93 is formed to reach a predetermined depth from the surface of the well layer 92 at a formation position of an element isolation area in the well layer 92. Specifically, a groove (a trench) is formed to reach the predetermined depth from the surface of the well layer 92 at the formation position of the STI 93 in the well layer 92. Subsequently, a silicon oxide film is formed inside of the trench by, for example, Chemical Vapor Deposition (CVD) so as to form the STI 93.

Here, while the STI 93 is disposed as the element isolation area, the element isolation area may be formed by Local Oxidation Of Silicon (LOCOS). For example, the element isolation area may be formed by ion implantation of oxygen into the formation position of the element isolation area in the semiconductor substrate 100 and then performing an annealing process.

Figure 10B:
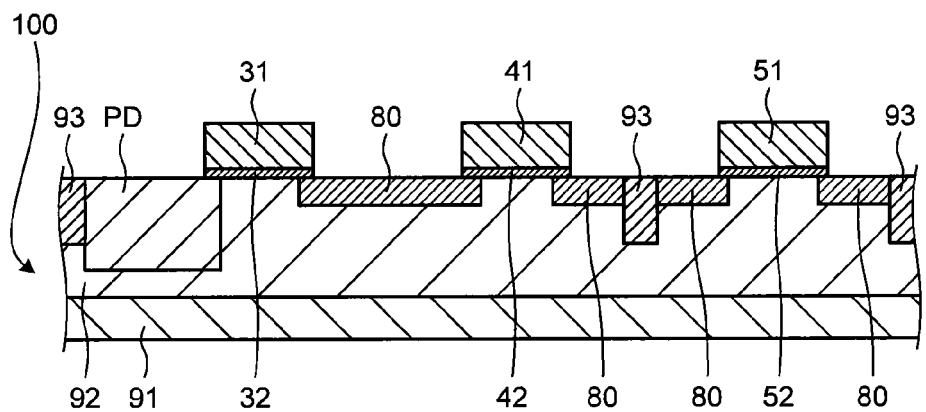

Subsequently, as illustrated in FIG. 10(b), the photoelectric conversion element PD is formed in the well layer 92. This photoelectric conversion element PD is formed by, for example, sequential ion implantations of N-type impurity and P-type impurity from a predetermined position on the top surface of the semiconductor substrate 100 and then performing an annealing process.

As illustrated in FIG. 10(b), the gate oxide films 32, 42, and 52 each formed of silicon oxide are formed on the top surface of the well layer 92 corresponding to the respective formation positions of the read-out transistor TR, the reset transistor RST, and the amplifying transistor AMP. Furthermore, the gate electrodes 31, 41, and 51 each formed of polysilicon are formed on the respective gate oxide films 32, 42, and 52.

Here, for example, a silicon oxide film and a polysilicon layer with respective predetermined film thicknesses are sequentially formed on the overall top surface of the well layer 92. Subsequently, a resist is formed by photolithography in order to selectively coat the top surface of the polysilicon layer in respective positions where the gate electrodes 31, 41, and 51 are to be formed.

Dry etching is performed using the resist as a mask, so as to remove the polysilicon layer and the silicon oxide film in the unnecessary portion, thus simultaneously forming the gate oxide films 32, 42, and 52 and the gate electrodes 31, 41, and 51.

Subsequently, as illustrated in FIG. 10(b), an LDD diffusion layer 80 is formed such that a desired pattern is formed by application of the resist and then N-type impurity such as arsenic and phosphorus is implanted by ion implantation into the respective formation positions for the floating diffusion FD, the drain 43 of the reset transistor RST, and the source 53 and the drain 54 of the amplifying transistor AMP.

Figure 10C:
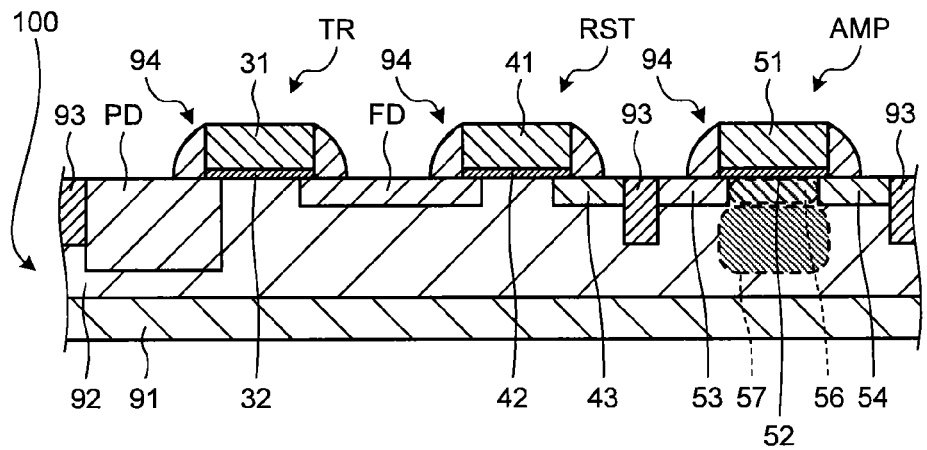

Subsequently, as illustrated in FIG. 10(c), the side wall 94 is formed by a known etchback on each side surface of the gate electrodes 31, 41, and 51. For example, a silicon nitride film is formed to cover each side surface of the gate electrodes 31, 41, and 51. Subsequently, a silicon oxide layer is formed on the overall top surface of the semiconductor substrate 100. The side wall 94 is formed by etchback of this silicon oxide layer using anisotropy plasma etching.

The N-type impurity implanted by ion implantation into the respective formation positions for the floating diffusion FD, the drain 43 of the reset transistor RST, and the source 53 and the drain 54 of the amplifying transistor AMP is activated by an annealing process, so as to form the floating diffusion FD, the drain 43 of the reset transistor RST, and the source 53 and the drain 54 of the amplifying transistor AMP.

The first concentration region 56 and the second concentration region 57 are formed inside the well layer 92 corresponding to the formation position of the amplifying transistor AMP. The first concentration region 56 and the second concentration region 57 are formed through which impurity is implanted at a deeper position than the position where the first concentration region 56 is formed and then an annealing process is performed, as described above. Thus, the first concentration region 56 and the second concentration region 57 have impurity concentrations different from those of the read-out transistor TR and the reset transistor RST.

Subsequently, the interlayer insulating film, the color filter, and the microlens are sequentially formed on the structure illustrated in FIG. 10(c). Thus, the pixel array 23 is manufactured.

As described above, in the solid-state imaging device 14 according to the first embodiment, the well layer 92 corresponding to the formation position of the amplifying transistor AMP includes the first concentration region 56 with low impurity concentration and the second concentration region 57 with higher impurity concentration than that of the first concentration region 56. The first concentration region 56 is disposed at least in a part of the maximum region 55 of the depletion layer. The second concentration region 57 is disposed in the deeper position than the first concentration region 56.

This ensures a small difference between: the width of the depletion layer formed in the dark situation where the FD voltage is high, and the width of the depletion layer formed in the bright situation where the FD voltage is low, thus improving the output linearity compared with the conventional amplifying transistor AMP_0.

While in the above-described first embodiment the example where the first concentration region 56 and the second concentration region 57 are formed after the gate electrode 51 is formed has been described, the first concentration region 56 and the second concentration region 57 may be formed before forming the gate electrode 51.

Second Embodiment

The amplifying transistor AMP may include a third concentration region with higher impurity concentration than that of the first concentration region 56 in a region at a shallower position than the first concentration region 56.

Figure 11:
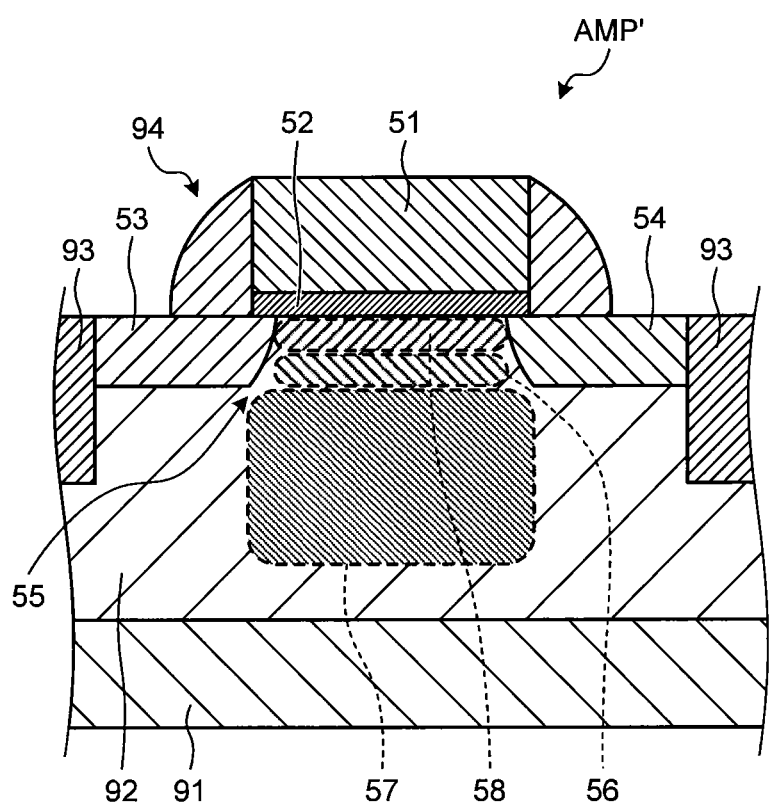
FIG. 11 is a schematic cross-sectional view of an amplifying transistor according to a second embodiment.
Figure 12:
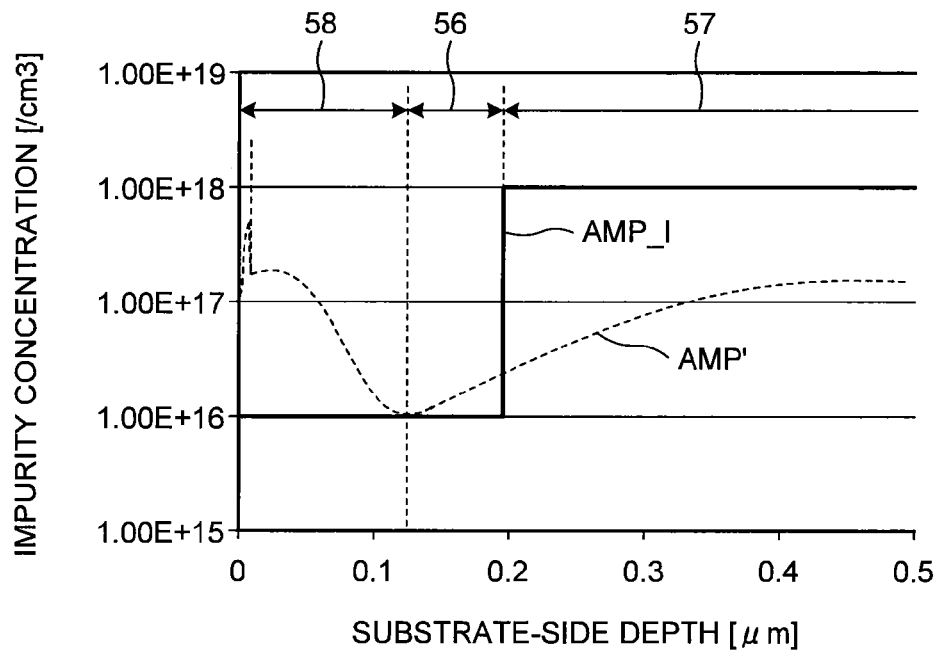
FIG. 12 is a graph illustrating a relationship between a substrate-side depth and impurity concentration in the amplifying transistor according to the second embodiment.

Hereinafter, this point will be described with reference to FIG. 11 and FIG. 12. FIG. 11 is a schematic cross-sectional view of an amplifying transistor according to the second embodiment. FIG. 12 is a graph illustrating a relationship between a substrate-side depth and impurity concentration in the amplifying transistor according to the second embodiment.

As illustrated in FIG. 11 and FIG. 12, an amplifying transistor AMP' according to the second embodiment includes a third concentration region 58 in a region at a shallower position than the first concentration region 56. This third concentration region 58 functions as a shield diffusion layer that prevents reception of noise signals due to the interface state of the semiconductor substrate 100 interface.

The third concentration region 58 is formed, similarly to the first concentration region 56 and the second concentration region 57, such that impurity such as boron is implanted by ion implantation into the well layer 92 and then an annealing process is performed. As described above, the amplifying transistor AMP' may include the third concentration region 58.

Third Embodiment

Figure 13:
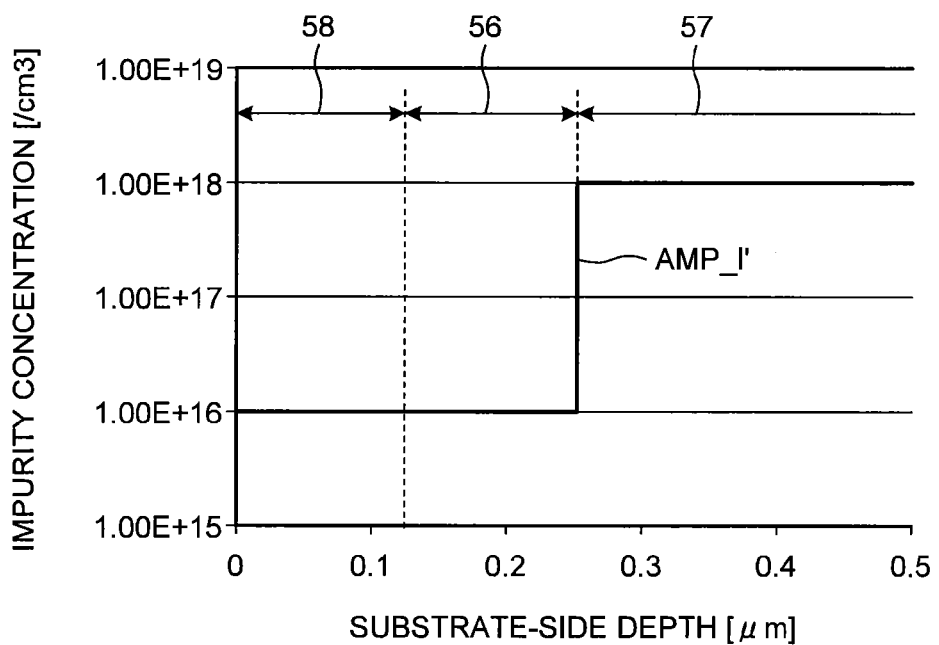
FIG. 13 is a graph illustrating a relationship between a substrate-side depth and impurity concentration of an ideal model according to a third embodiment.

In each embodiment described above, the example where the first concentration region 56 and the second concentration region 57 are formed based on the ideal model AMP, in which the impurity concentration is changed at the position of 0.2 μm, has been described. However, the first concentration region 56 and the second concentration region 57 may be formed based on the ideal model other than the ideal model AMP_I. This point will be described with reference to FIG. 13. FIG. 13 is a graph illustrating a relationship between a substrate-side depth and impurity concentration of the ideal model according to a third embodiment.

As illustrated in FIG. 13, in the ideal model AMP_I', a region with constant impurity concentration of 1.00E+16

(/cm3) and a region with constant impurity concentration of 1.00E+18 (/cm3) are adjacent to each other at a substrate-side depth of 0.25 µm.

In the amplifying transistor according to the third embodiment, the first concentration region 56 and the second concentration region 57 are formed based on this ideal model AMP_I'. Accordingly, the first concentration region 56 is formed across the region at a deeper position than 0.2 µm, which is the maximum depth of the depletion layer, that is, across the region at a deeper position than the region where the source 53 and the drain 54 are formed. Additionally, the second concentration region 57 is formed at the deeper position than the formation position of the second concentration region 57 in each embodiment described above.

As described above, the first concentration region 56 may be formed across the region at a deeper position than the maximum region 55 of the depletion layer and the region where the source 53 and the drain 54 are formed. Alternatively, the first concentration region 56 may be formed in the region at a deeper position than the region where the source 53 and the drain 54 are formed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solid-state imaging device comprising:
   a photoelectric conversion element configured to photoelectrically convert incident light into electric charges with an amount corresponding to an amount of the incident light and accumulate the electric charges;
   a floating diffusion configured to accumulate the electric charges read out from the photoelectric conversion element; and
   an amplifying transistor with a gate electrode connected to the floating diffusion, the amplifying transistor being configured to output a signal based on the amount of the electric charges accumulated in the floating diffusion, wherein
   the amplifying transistor includes:
     a source;
     a drain;
     a first concentration region disposed in a depletion layer formed between the source and the drain; and
     a second concentration region disposed at a deeper position than the first concentration region, the second concentration region having higher impurity concentration than that of the first concentration region, and
   a depth of the first concentration region is shallower than those of the source and the drain of the amplifying transistor when being viewed from the gate electrode toward the first and second concentration regions.

2. The solid-state imaging device according to claim 1, wherein
   the first concentration region is disposed across the maximum region of the depletion layer and a region at a deeper position than respective maximum depths of a source and a drain of the amplifying transistor.

3. The solid-state imaging device according to claim 1, wherein
   the amplifying transistor includes a third concentration region with higher impurity concentration than the impurity concentration of the first concentration region in a region at a shallower position than the first concentration region.

4. The solid-state imaging device according to claim 1, wherein
   the first concentration region has impurity concentration equal to or less than ½ of the impurity concentration of the second concentration region.

5. The solid-state imaging device according to claim 1, wherein
   the first concentration region and the second concentration region are disposed adjacent to each other.

6. The solid-state imaging device according to claim 1, further comprising:
   a read-out transistor that reads out the electric charges accumulated in the photoelectric conversion element; and
   a reset transistor that resets the electric charges accumulated in the floating diffusion, wherein
   the first and second concentration regions have impurity concentrations different from those of the read-out and reset transistors.

7. The solid-state imaging device according to claim 1, wherein a depth of the second concentration region is deeper than that of an element isolation area.

* * * * *